Figure 1:
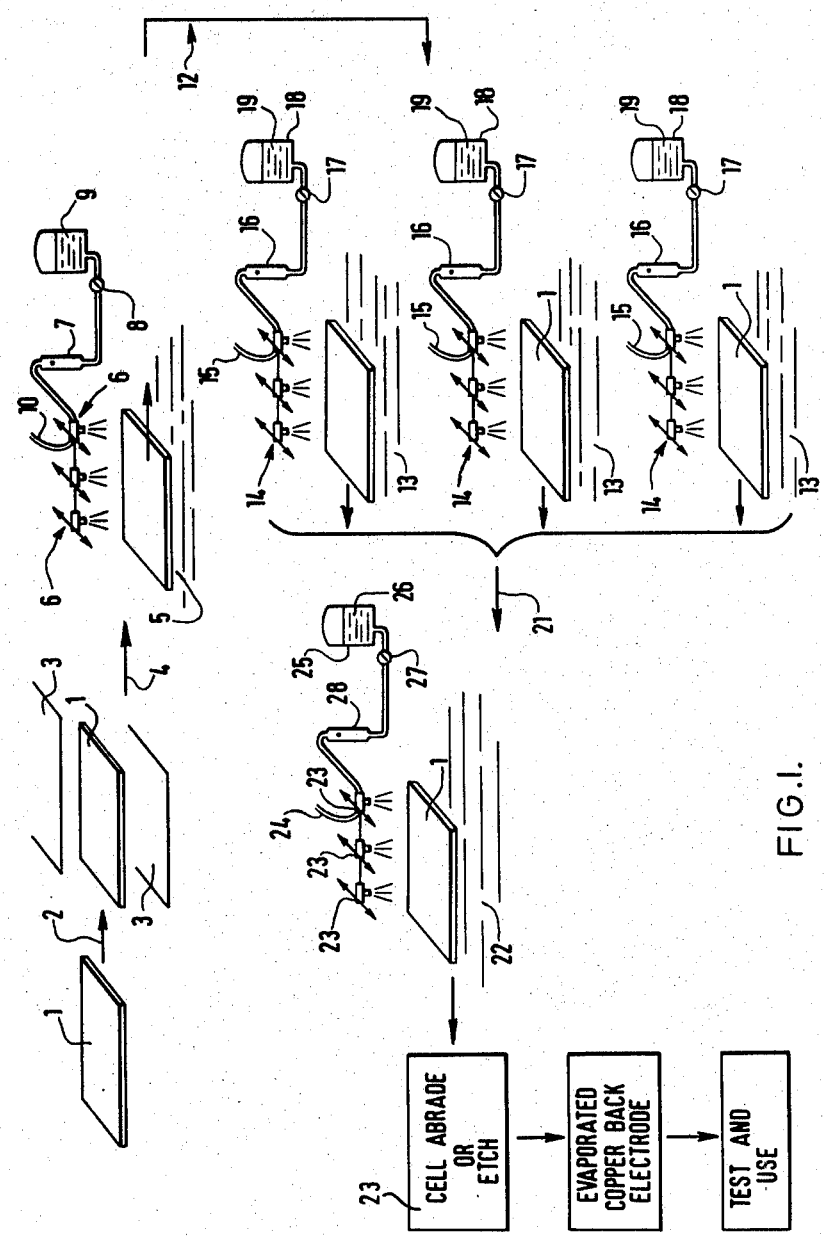

United States Patent [19]

Laurie et al.

[11] 4,403,398

[45] Sep. 13, 1983

[54] METHOD OF MANUFACTURING A CADMIUM SULPHIDE PHOTO-VOLTAIC DEVICE

[75] Inventors: Alexander S. Laurie, Melbourn; Robert C. Whelan, Comberton, both of England

[73] Assignee: Prutec Limited, England

[21] Appl. No.: 328,926

[22] Filed: Dec. 9, 1981

[30] Foreign Application Priority Data

Dec. 12, 1980 [GB] United Kingdom ............. 8039836

[51] Int. Cl.$^3$ .................. H01L 21/363; H01L 31/06
[52] U.S. Cl. .................................. 29/572; 29/583; 29/591; 136/260; 357/30; 357/61; 427/74
[58] Field of Search ............ 136/260; 29/572, 583, 29/589, 590, 591; 427/74, 84, 86, 87; 357/4, 16, 30, 61, 62

[56] References Cited

U.S. PATENT DOCUMENTS 4,143,235 3/1979 Duisman ................. 136/260 X

Primary Examiner—L. Dewayne Rutledge
Assistant Examiner—Alan E. Schiavelli
Attorney, Agent, or Firm—Ostrolenk, Faber, Gerb & Soffen

[57] ABSTRACT

The invention relates to the manufacture of a cadmium sulphide photo-voltaic device. A substrate such as a glass is coated with successive layers which are made, in order, of tin oxide, cadmium sulphide, cuprous sulphide and copper to build up a photo-voltaic junction. In order to achieve a fast deposition rate of the cadmium sulphide while achieving a well ordered crystal structure the cadmium sulphide layer is deposited in two stages, the first involving spraying of a weak precursor solution and the second a substantially more concentrated solution to achieve at least a five times increase in the deposition rate. The invention also describes improved techniques for spraying and reducing the effects of the resistivity of the tin oxide first electrode.

10 Claims, 4 Drawing Figures

METHOD OF MANUFACTURING A CADMIUM SULPHIDE PHOTO-VOLTAIC DEVICE

The present invention relates to a method of manufacturing photo-voltaic cells and to photo-voltaic cells made by the method.

It is known to make photo-voltaic cells by depositing tin oxide, cadmium sulphide, cuprous sulphide and copper successively on a sheet of glass. The use of a transparent substrate offers the advantage that the device can be illuminated from either direction thereby allowing the device to be used in a so-called back wall mode. It is important to achieve as well ordered a crystal structure as possible within the cadmium sulphide layer. Various proposals have been made for the deposition of this layer including vapour deposition techniques and techniques wherein a precursor solution is sprayed onto the heated tin oxide layer. Vapour deposition results in the better crystal structure but is expensive. With spray deposition, on the other hand, the crystal structure is dependent upon the speed of deposition and if a low speed is adopted to achieve the desired crystal structure then the yield of the manufacturing plant is reduced thereby increasing the unit cost.

The present invention is concerned with a method of manufacturing cadmium sulphide photo-voltaic devices in which at least some of the foregoing problems are mitigated.

In accordance with the present invention, there is provided a method of manufacturing a cadmium sulphide photo-voltaic device which comprises forming a conductive layer to act as a first electrode, depositing on the conductive layer a layer of cadmium sulphide, forming a layer of copper sulphide in contact with the cadmium sulphide layer to produce a photo-voltaic junction, and forming a second electrode in contact with the copper sulphide; wherein the step of depositing the cadmium sulphide layer comprises spraying onto the heated conductive layer a first solution of precursor having such a cadmium concentration as to result in cadmium sulphide being deposited at a relatively slow first rate and subsequent spraying with a second solution having a significantly greater cadmium concentration such that cadmium sulphide is deposited at a rate at least five times greater than the first rate.

The grain structure of the cadmium sulphide layer is also affected by the droplet size produced by the spraying head. In accordance with the preferred feature of the invention, in order to achieve a very fine spray, the spray head is an ultrasonic spray head in which the atomisation is at least assisted by acoustic energy.

This invention relates to a method of making photo-voltaic cells and to photo-voltaic cells made by the method.

It is known to make photo-voltaic cells which can be operated in a backwall mode and which have, as a substrate, upon which junction layers are formed, a sheet of conducting glass. The glass is normally made conducting by applying a layer of transparent conducting material, for example tin oxide, to one of its surfaces. Users of photo-voltaic cells normally require them to cover as large an area as is practically possible, but a disadvantage of a cell of large area made as a single body on a single sheet of substrate material is that the resistivity of the conducting layer, for example tin oxide, becomes significant. Thus the output from the cell becomes limited by the resistivity of the transparent electrode.

The present invention provides a way in which a large number of photo-voltaic cells of comparatively small area can be made by a mass production process and be connected together by connections of low resistivity, thereby enabling large areas of such cells to be constructed while minimising the problem of the resistivity of the conducting layer on the substrate.

Figure 2:
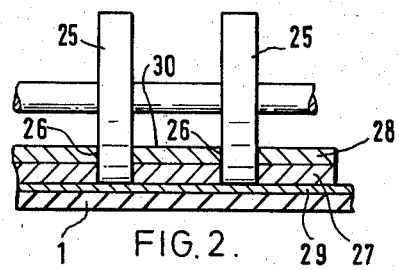
Figure 3:
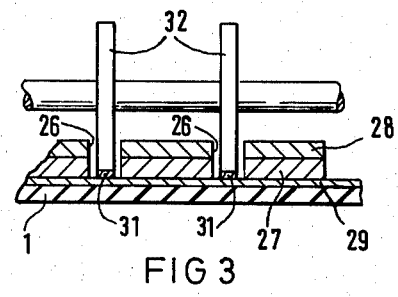
Figure 4:
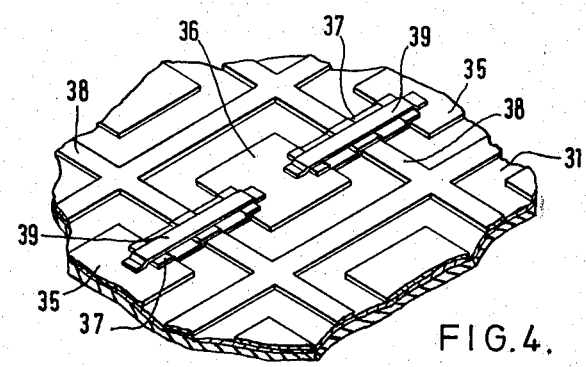

The invention will now be described further by way of example, with reference to the accompanying drawings in which:

FIG. 1 shows a diagrammatic perspective view of successive steps in a production process, FIG. 2 shows a cross-section through an arrangement for dividing a cell, FIG. 3 shows a cross-section through an arrangement for printing a conducting pattern and FIG. 4 shows a perspective view of a part of a cell assembly.

Referring to FIG. 1, there is shown a glass sheet 1 which is some 1 meter long, 1 meter wide and 2 millimeters thick. Preferably the substrate is between 1-3 mm. As is indicated by the arrow 2, the sheet 1 is first passed into a furnace 3 where it is heated to a temperature between 400° C. and 650° C., the preferred temperature depending on the composition of the glass and being 450° C. for soda glass. The heated glass sheet 1 is then passed, as is indicated by the arrow 4 to a stage in which it is floated on a bath of molten tin, indicated at 5, and moved progressively past a series of reciprocating spray nozzles 6, each of which is coupled via a flowmeter 7 and a flow control valve 8 to a container of tin oxide precursor solution 9 and to an air line 10. The melting point of the tin 5 can be controlled to some extent by adding other metals which cause it to be depressed. Precautions which are well known, such as a reducing gas atmosphere, are taken to mitigate the effect of oxidation of the tin. The precursor solution 9, which is sprayed on to the glass sheet 1, includes a concentrated solution of stannic chloride to which has been added 1% of antimony trichloride and a small amount of concentrated hydrochloric acid. The antimony chloride is added in order to reduce the resistivity of the spray deposited tin oxide coating and the small amount of concentrated hydrochloric acid is added in order to inhibit the result of this addition of antimony chloride which results in the formation of oxychlorides and a tendency for the solution to become turbid.

A transparent conducting film can be prepared by some other well established technique, for example by using anhydrous stannous chloride dissolved in butyl acetate or methanol or any other suitable organic solvent. Furthermore, it is not essential to the practice of a method in accordance with the invention for the conducting layer to be applied by a spraying process, neither is it necessary that the substrate be supported during the application of the conducting layer to one of its surfaces by being floated on a liquid. It could be supported and heated to the requisite temperature in any other known way.

Following the application of the conducting layer to the surface of the glass sheet 1 forming the substrate, the sheet 1 is transferred to a further stage of the process, as indicated by arrow 12, and it is cooled during the transfer to a temperature between 250° C. and 400° C., typically 350° C. The rate of movement of the glass sheet 1 supported by the molten tin 5, together with the density of the tin oxide solution sprayed on to it, are such that the treated glass substrate has a transmission of light in the visible range of around 70%–90% and a room temperature resistivity in the region of 10–20 Ohms per square. This resistivity value corresponds to a film thickness of 0.3–0.5 μm.

Such a tin oxide layer is acceptable when the device is to be illuminated from either side but if it is acceptable for the substrate to be opaque then a greater thickness of tin oxide is preferred to reduce the resistivity.

The rate of passage of the glass sheet 1 through the succeeding stage is considerably slower and the drawing therefore indicates three parallel baths 13 of molten tin. The three baths of molten tin at similar temperatures within the range 250° C.–400° C., typically 350° C., are thermally isolated from the first to achieve the desired temperature difference in the tin and they support respective glass sheets 1 bearing conducting tin oxide coatings which have been received via the flow line 12 and the first treatment stage. The use of three baths of molten tin 13 enables the process to flow smoothly and each sheet as it passes over the surface of the metal 13 is sprayed from a respective reciprocating multiple spray head 14 which is coupled to a respective air line 15 and via a flow meter 16 and a control valve 17 to a container 18 with a cadmium sulphide precursor solution 19. The temperature of the molten tin 13 is typically 350° C. and the cadmium sulphide solution 19 is water based. The preferred source of the cadmium ions is cadmium chloride, while thiourea has been found to be a suitable source of sulphur, The proportions of the two ingredients for the cadmium sulphide solution 19 are adjusted such that the overall ratio of sulphur to cadmium ions is within the range 0.8:1 to 1.2:1, a preferred ratio being 1:1.

It is important that, as far as possible, the sprayed cadmium sulphide films should be uniform and the crystal structure should be correctly orientated.

In addition to the parameters already quoted including deposition temperatures and spray rates, two other factors are relevant to the deposition of satisfactory CdS films.

Firstly, it has been found that the preparation of films with the optimum photo-voltaic characteristics, requires the use of very low deposition rates in the region of 0.1–1.0 μm per hour, a preferred value being 0.5 μm per hour. Whilst it would be desirable to deposit the entire film thickness at this rate, this would not be consistent with the time constraints on the process.

An acceptable compromise has been formulated whereby a layer of CdS, in the range of 0.2 μm–0.8 μm, a preferred thickness being 0.5 μm, is first deposited at the low deposition rate. The preferred deposition rate corresponds to a solution concentration of about 0.01 M. A second film is then deposited on the first layer at a higher deposition rate, corresponding to a solution concentration in the region 0.02 M to 0.15 M, a preferred value being 0.05 M. (All molar concentrations quoted are with respect to the cadmium ion). The thickness of the second film deposited in this way is in the region of 3.5–5.5 μm, a preferred thickness corresponds to a deposition time of about 90 minutes. This dual deposition technique is effective in that the presence of a well ordered base film provides a template on which the secondary film is able to assume a similar crystallographic orientation. In terms of deposition time, the process can be reduced from about 6 hours, corresponding to deposition of the first layer at the slow rate, to two and a half hours, using the procedure described above of depositing a first layer at a slow rate and a second layer at a faster rate. Where conditions other than the preferred conditions have been used the above approach will effectively reduce the deposition time of the cadmium sulphide film by about 50%.

It is believed that individual droplets of the spray decompose to give micro crystalites of cadmium sulphide. If the droplet size is excessively large then the corresponding micro-crystal will not be sufficiently mobile to locate itself appropriately on the substrate as an integral part of the ordered lattice. The result is an inhomogeneous film. Atomisation by an air stream alone gives rise to a very wide distribution in droplet size, and has therefore been found to be associated with the above film defects.

A more acceptable alternative to this form of atomisation is to use ultrasonic atomisation. This technique gives finer droplet to improve the crystal structure of the deposited film.

In one ultrasonic spray head a spray is directed towards the hollow of a cup placed at predetermined distance in front of the spray nozzle. The volume between the spray nozzle and the facing cup forms a resonant cavity at ultrasonic frequencies which causes a much finer division of the liquid droplets.

It is desirable that the deposited cadmium sulphide be uniform even when inspected by a X10 viewer.

The preferred orientation of the individual cadmium sulphide crystallites, as detected by X-ray diffraction studies, should be essentially in the 0002 direction. The resistivity of the cadmium sulphide should be of the order of 100 Ohm centimeters and should be n-type.

The step of spraying cadmium sulphide on each of the three tin oxide coated glass sheets 1 is completed at respective successive instants of time and the glass sheets 1 are then cooled to a temperature of about 200° C. and passed; as is indicated by arrow 21 successively to a bath of molten metal 22, preferably tin or a low melting point alloy, at a temperature within the range 100°–250° C., a preferred temperature being 150° C. The surface temperature of the sheet 1 floating on the metal 22 is within the range 100°–200° C. a preferred temperature being 110° C. and during its passage through the bath containing the metal 22, the sheet 1 has a thin layer of cuprous sulphide deposited on it. The cuprous sulphide is deposited on the cadmium sulphide layer on the heated glass substrate 1 by spraying a solution containing the precursor elements in an organic solvent of copper and sulphur via multiple spray heads 23 to which are coupled an air line 24 and a container 25 of the precursor solution 26 via a flow control valve 27 and a flowmeter 28.

A preferred precursor solution comprises copper acetate as the source of copper and NN' Dimethylthiourea which provides the sulphur. The copper sulphide precursor solution 26 has a strength within the range 0.001 to 0.01 M, a preferred concentration being 0.005 M. (The molar concentrations quoted are with respect to the copper ion). The copper/sulphur ratio in the solution is maintained within the range 1.7:1 and 2.2:1, a preferred ratio being 2:1. This ensures that the film of cuprous sulphide will be deposited crystallographically in the chalcocite form. The substrate temperature is maintained as close as possible within a few degrees above 100° C. The optimum thickness of the layer of cuprous sulphide is in the range 1000 to 1500 angstrom units and the duration of the spray period which is typically ten–twenty minutes controls the thickness of the film deposited.

Having spray deposited a large area photo-voltaic junction it is then desirable to divide the area into a number of separate cells. It is possible, as a result of dividing-up the area, to increase the level of power which can be drawn from the cell, which otherwise is limited by the electrical resistance of the underlying tin oxide film, and to isolate from the working area parts of the photo-voltaic junction which, due to physical defects and other structural inhomogeneities in the sprayed films, can give rise to short circuit breakdowns through the junction. This orderly division of the cell area can be accomplished via several routes, all of which depend on providing a highly conducting grid in contact with the more resistive tin oxide film.

In the particular method being described, the coated substrate 1 is removed from the bath containing the molten metal 22 and cooled to room temperature. It is then passed to an abrasion or etching stage 23, indicated in FIG. 1 where the division of the cell area is made.

An arrangement for carrying-out the abrasion step will now be described with reference to FIG. 2 in which a glass sheet 1 coated with layers of cadmium sulphide and copper sulphide in the way described above and a series of rotating grinding wheels 25 are shown being moved relative to one another in such a way that a series of parallel channels 26 are cut through the layer 27 of cadmium sulphide and the layer 28 of copper sulphide, which are removed comparatively easily to expose, at the bottom of the channels 26, strips of a layer 29 of the more refractory tin oxide film. Upon the completion of the cutting of the channels 26, the sheet 1 is rotated through 90° and a second series of channels is cut through the layers 28 and 29 to expose strips of the layer 29 at right angles to the previously exposed strips thereby providing a grid pattern of strips of the tin oxide film and forming a number of separate photo-voltaic cells 30.

A metal loaded epoxy composition layer 31 is then printed on to each of the disclosed strips of the layer 29, as shown in FIG. 3 by means of printing wheels 32, which traverse the sheet first in one direction and then in a direction at right angles to the first direction along the channels that have been cut in the cadmium and copper sulphide layers. The electrically conducting metal loaded epoxy resin composition layers 31 are then cured, either at room temperature or by heating at around 100° C. for a period of the order of 30 minutes.

In another method of providing a number of cells on the same substrate which are physically separated, but which each have one electrode connected to the corresponding electrode of the others via an element which is a better conductor than the said one electrode, a pattern corresponding to the grid where the higher conductivity material is subsequently to be deposited is printed, by means of a film of silicon grease and using, for example, an offset process, on to the tin oxide coated substrate prior to the step of depositing the cadmium sulphide film. The steps of the process shown in FIG. 1 are then followed through until the stage 23 is reached. In the particular method being described, the sheet 1 which has been coated with cadmium sulphide and copper sulphide is then washed, during stage 23, in hexane, until the film of silicon grease and the portions of the layers deposited thereon have been removed, thereby disclosing a grid of tin oxide, corresponding to the pattern of silicon grease, and upon which a layer having better electrical conductivity than the tin oxide can be deposited in a similar way to the layer 31 shown in FIG. 3.

As a further alternative, the conductive grid can be laid over the tin oxide layer before the cadmium sulphide layer is formed. This technique finds use when all the cells are connected in parallel. In this embodiment the material of the grid must be selected so as not to react with the cadmium sulphide layer.

It is possible to provide a grid pattern layer, similar to that shown at 31 in FIG. 3, by methods involving high temperature techniques, before the cadmium sulphide and copper sulphide layers are deposited. For example, an electrically conducting metal powder can be sprayed by means of a gas plasma directly on to the glass substrate 1 through a suitable mask so as to provide a grid pattern of conducting strips across the surface of the glass substrate. In another method the grid pattern is established directly on to the glass substrate by depositing a succession of conducting layers on to the substrate through a suitable mask.

In yet another method involving high temperature techniques, a thick film conductor paste, for example a cermet material, which yields a highly conducting material, having the property of adhering to the glass substrate when fired, is applied directly to the substrate in the required, preferably grid, pattern by means of a roller or by screen printing and then fired. Suitable compositions are based on silver or aluminium and the thickness of the fired film is in the region of 10-20 $\mu$m, while the sheet resistivity of the fired film should not be greater than 0.01 Ohms per square. Following the establishment of the grid pattern on the substrate, a tin oxide layer is deposited over the surface carrying the grid pattern and the process then proceeds in the way previously described, with the subsequent deposition of the layers of cadmium sulphide and copper sulphide.

It is a requirement of all the methods described that the junction between the metal forming the grid and the tin oxide film should be Ohmic and of low electrical resistance.

In yet a further embodiment, instead of starting with a glass sheet of the order of 1 meter square it is possible to employ a plurality of substrate elements of smaller surface area, for example 5 centimeters long by 3 centimeters wide and to pass them through a similar process to that described with reference to FIG. 1. The only essential difference being that instead of the conducting coating of tin oxide extending over only one surface of the sheet 1 it extends over all of the surfaces of the sheet. It is then possible to assemble the individual smaller size elements on the surface of a transparent substrate which carries a transparent coating of high electrical conductivity over its whole surface, a transparent coating of lower electrical conductivity in the regions where the smaller elements lie, with a grid assembly of high conductivity arranged between them, or a non-transparent, but narrow width comparatively high electrical conductivity grid structure arranged to contact the lower conducting surfaces of the smaller elements.

Having fabricated the photo-voltaic junction it is now necessary to apply a backing electrode.

An evaporated film of copper metal is satisfactory for this purpose, it being necessary to ensure, however, that the stock for evaporation, is of the oxygen free variety.

Alternatively a copper metal loaded silicone or epoxy composition can be screen printed or sprayed onto the designated active cell area.

It is also necessary to provide interconnections between these backing electrodes.

An arrangement suitable for this purpose is shown in FIG. 4 in which an interconnection is made between backing electrodes 35 and 36. An insulating cross-over 37 is first printed as a bridge across a current collecting electrode 38 which links the conducting areas 35 and 36. Finally an interconnection 39 is put down, by screen printing a strip 40 of copper loaded epoxy within the boundaries of the cross-over 37. The copper loaded epoxy composition can either be heat cured at a temperature not exceeding 100° C., or alternatively allowed to cure at room temperature.

All electrode connections are taken to the outside edges of the active area by means not shown where connection is made to a metal bus bar system which also forms part of a support structure for the array.

In order to improve the electrical properties of the cell it is advisable to provide a suitable heat treatment, so as to enable the cuprous ions to migrate towards the junction. Such a heat treatment may consist of heating the cells for 15-20 mins. at a temperature within the range 100°-200° C.

In the particular embodiment described with reference to the accompanying drawings, the three tin oxide coated glass sheets 1 are each cooled to a temperature of about 200° C., after having been sprayed in a two stage process with cadmium sulphide, as is indicated by the arrow 21 in FIG. 1.

It has been found to be advantageous to submit the sprayed-on cadmium sulphide film, before the step 21 of cooling it to around 200° C., to a step of heat treatment in which it is heated to a temperature within the range 500° C. to 600° C. for a period of between 5 and 45 minutes. A preferred heat treatment is at 550° C. for 15 minutes. It is believed that this heat treatment drives off undesired reaction products and improves the crystal structure of the cadmium sulphide layer.

As an alternative to forming the photo-voltaic junction by the spray process described above, the junction may be created directly on the sprayed cadmium sulphide film by means of a wet chemical treatment in which copper is substituted for the cadmium in the cadmium sulphide layer.

A specific example of a suitable junction forming procedure will now be described.

A cadmium sulphide film is immersed for about 5 to 10 seconds, in a solution of the following composition:

200 gms. of ammonium chloride, together with 2 gms. of cuprous chloride are dissolved in oxygen-free deionised water and the solution made up to a volume of one liter. To the solution is added one gram of hydrazine hydrochloride, in order to prevent the oxidation of cuprous ions, together with sufficient dilute hydrochloride acid to bring the solution to pH 5.0. The solution is then heated to 90° C. and the dipping process is carried out as described. Finally the treated cadmium sulphide film is rinsed and dried.

The copper backing electrode system is then applied in the way described above.

It will be understood that, although the invention has been described, by way of example, with reference to particular embodiments, variations, combinations and modifications can be made within the scope of the invention.

We claim:

1. In a method of manufacturing a cadmium sulphide photo-voltaic device which comprises;
    forming a conductive layer to act as a first electrode, depositing on the conductive layer a layer of cadmium sulphide,
    forming a layer of copper sulphide in contact with the cadmium sulphide layer to produce a photo-voltaic junction, and
    forming a second electrode in contact with the copper sulphide;
    the improvement wherein the step of depositing the cadmium sulphide layer comprises;
    spraying onto the heated conductive layer a first precursor solution having such a cadmium concentration as to result in cadmium sulphide being deposited at a relatively slow first rate, and
    subsequently spraying with a second solution having a significantly greater cadmium concentration such that cadmium sulphide is deposited at a rate at least five times greater than the first rate.

2. A method as claimed in claim 1, wherein the spraying is carried out using an ultrasonic spray head in order to achieve fine division of the solution droplets.

3. A method as claimed in claim 1, in which after the position of the cadmium sulphide layer, the said layer is heated to a temperature within the range from 500° to 600° C. for a period of from 5 to 45 minutes in order to drive off undesired reaction products and improve the crystal structure of the cadmium sulphide layer.

4. A method as claimed in claim 1, in which the step of forming a copper sulphide layer comprises spraying onto the cadmium sulphide layer a precursor solution to build up a cuprous sulphide layer over the cadmium sulphide layer.

5. A method as claimed in claim 1, in which the step of forming the layer of copper sulphide comprises dipping the cadmium sulphide layer into a solution containing copper and which reacts with the cadmium sulphide layer to substitute copper for the cadmium within the layer.

6. A method as claimed in claim 1, in which the step of forming a second electrode includes depositing a layer of copper over the copper sulphide layer and heating the copper sulphide layer to cause migration of copper towards the photo-voltaic junction and adjust the stoichiometry of the copper sulphide layer.

7. A method as claimed in claim 1, in which the photo-voltaic junction covers a large area and in which in order to reduce the resistivity of the first electrode, the device is divided up into cells by forming a grid of conductive material in contact with the first electrode.

8. A method as claimed in claim 7, in which following the formation of the second electrode, the photo-voltaic junction is abraded in a grid pattern to remove the cadmium sulphide and subsequent layers and to expose the first electrode, and electrically conductive material being deposited within the grid pattern to contact the first electrode.

9. A method as claimed in claim 8 which comprises additionally forming electrically conductive bridges to contact the second electrode of the individual cells while remaining electrically isolated from the grid in contact with the first electrode.

10. A method as claimed in claim 7, in which an electrically conductive grid is deposited over the first electrode prior to the deposition of the cadmium sulphide layer.

* * * * *